United States Patent
Ogino et al.

(10) Patent No.: US 9,769,401 B2
(45) Date of Patent: Sep. 19, 2017

(54) SOLID-STATE IMAGING APPARATUS, METHOD OF MANUFACTURING THE SAME, AND CAMERA

(71) Applicant: CANON KABUSHIKI KAISHA, Tokyo (JP)

(72) Inventors: Takumi Ogino, Koganei (JP); Hiroshi Ikakura, Kawasaki (JP); Yukihiro Hayakawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/179,035

(22) Filed: Jun. 10, 2016

(65) Prior Publication Data

US 2016/0373665 A1 Dec. 22, 2016

(30) Foreign Application Priority Data

Jun. 18, 2015 (JP) ................. 2015-123107

(51) Int. Cl.
*H04N 5/335* (2011.01)
*H04N 5/357* (2011.01)
*H01L 27/146* (2006.01)

(52) U.S. Cl.
CPC ....... *H04N 5/357* (2013.01); *H01L 27/14629* (2013.01); *H01L 27/14636* (2013.01); *H01L 27/14685* (2013.01); *H01L 27/14621* (2013.01); *H01L 27/14627* (2013.01); *H01L 27/14643* (2013.01)

(58) Field of Classification Search
CPC ..................................... H04N 5/357
USPC ....................................... 348/294
See application file for complete search history.

(56) References Cited

U.S. PATENT DOCUMENTS

| | | | |
|---|---|---|---|
| 7,442,973 B2 | 10/2008 | Komoguchi et al. | |
| 7,842,986 B2 | 11/2010 | Komoguchi et al. | |
| 8,993,386 B2* | 3/2015 | Ohara ............... | C01G 15/006 257/E21.414 |
| 9,030,587 B2 | 5/2015 | Suzuki et al. | |
| 2012/0223307 A1* | 9/2012 | Sakata ............. | H01L 21/02565 257/43 |
| 2014/0175436 A1* | 6/2014 | Yamazaki .......... | H01L 27/1225 257/43 |
| 2014/0374863 A1 | 12/2014 | Ogino | |

(Continued)

FOREIGN PATENT DOCUMENTS

JP 2004-193500 A 7/2004

*Primary Examiner* — Usman Khan
(74) *Attorney, Agent, or Firm* — Fitzpatrick, Cella, Harper & Scinto

(57) ABSTRACT

A solid-state imaging apparatus is provided. The apparatus comprises a pixel region where a photoelectric conversion element is arranged, a first insulating film having a first opening portion which is over the photoelectric conversion element, a first insulator comprising a first portion arranged in the first opening portion, and a second portion covering an upper surface of the first portion and an upper surface of the first insulating film, a second insulating film having a second opening portion which is over the first opening portion, and a third portion arranged in the second opening portion. A hydrogen concentration of the second portion is higher than a hydrogen concentration of the first insulating film. An upper surface area of the first portion is larger than a lower surface area of the third portion which is over the first portion.

15 Claims, 4 Drawing Sheets

(56) References Cited

U.S. PATENT DOCUMENTS

| | | |
|---|---|---|
| 2015/0179692 A1 | 6/2015 | Furuta et al. |
| 2015/0214269 A1* | 7/2015 | Endo ................. H01L 27/14685 257/443 |
| 2015/0333098 A1 | 11/2015 | Endo et al. |
| 2016/0365462 A1* | 12/2016 | Shoyama ............ H01L 31/0288 |

* cited by examiner

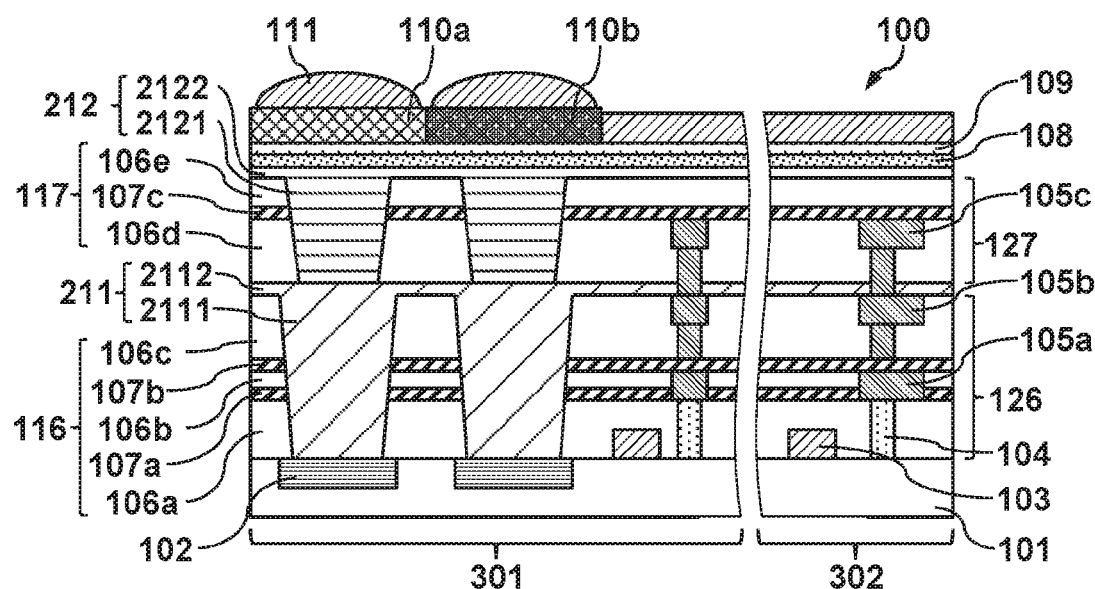
F I G. 1A
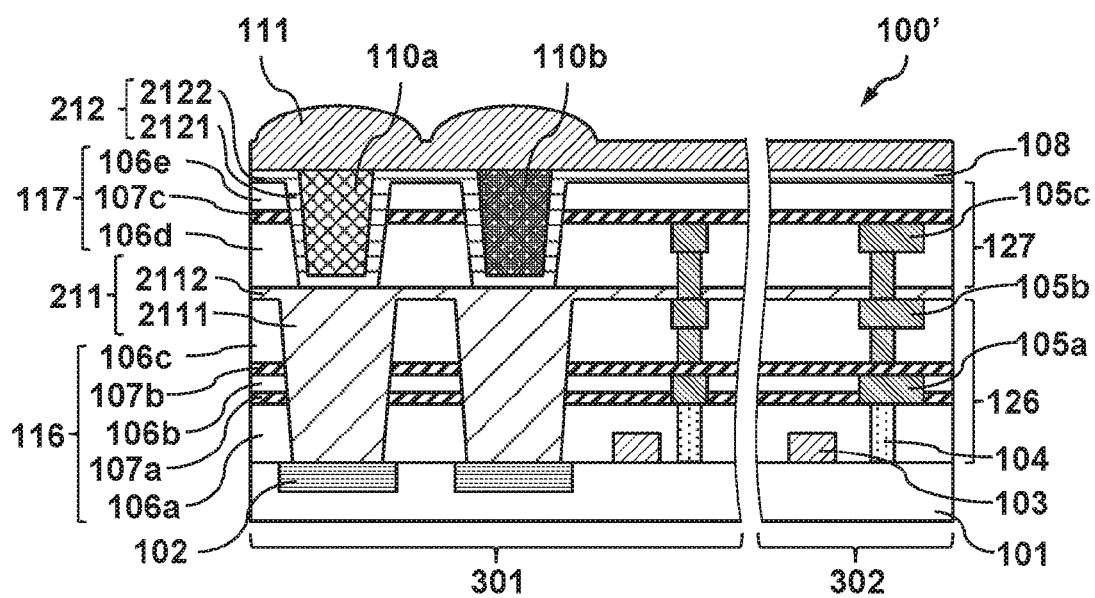
F I G. 1B

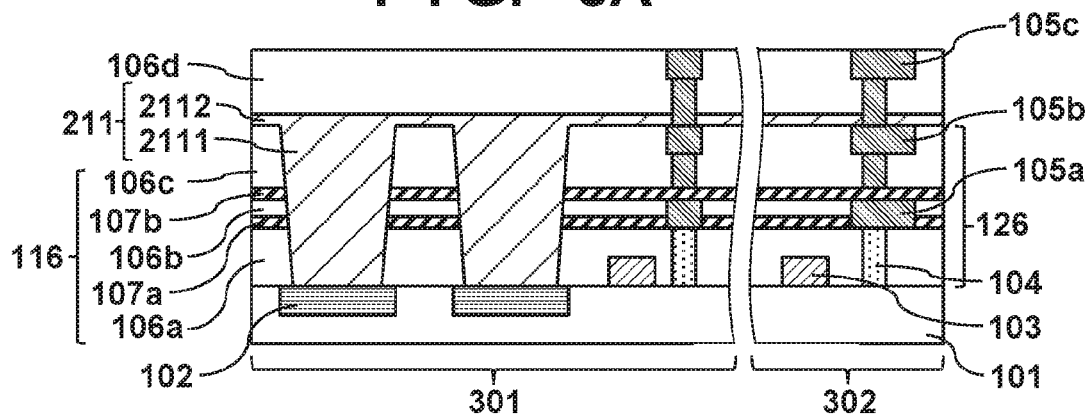
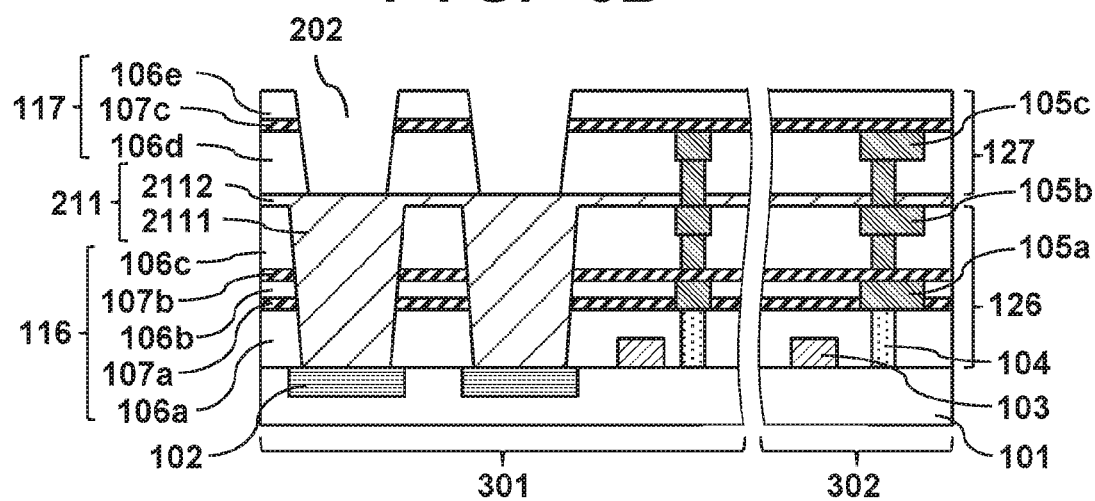
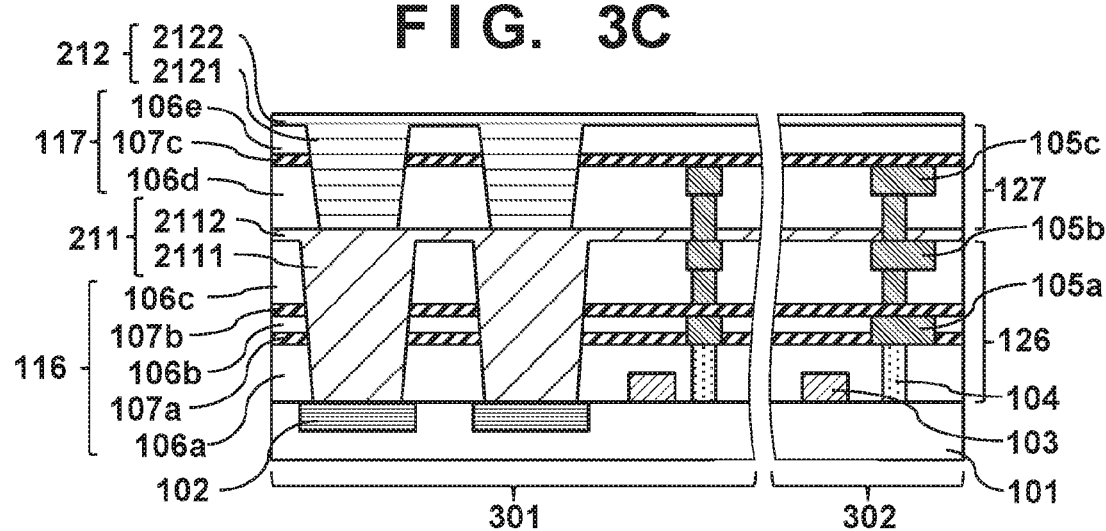

//\*\*\*

SOLID-STATE IMAGING APPARATUS, METHOD OF MANUFACTURING THE SAME, AND CAMERA

BACKGROUND OF THE INVENTION

Field of the Invention

The present invention relates to a solid-state imaging apparatus, a method of manufacturing the same, and a camera.

Description of the Related Art

In a solid-state imaging apparatus, an arrangement is known where a light waveguide which collects light entering a photoelectric conversion portion is formed in order to improve sensitivity. Japanese Patent Laid-Open No. 2004-193500 has disclosed a solid-state image sensor which forms a light waveguide using silicon nitride by dividing it vertically in order to suppress occurrence of a void in an embedded step of forming the light waveguide.

SUMMARY OF THE INVENTION

Miniaturization of pixels in a solid-state imaging apparatus is progressing. With the miniaturization, the level of an output signal tends to be low. Thus, a further reduction in noise is desired.

Some embodiments of the present invention provide a technique advantageous in controlling occurrence of noise in the solid-state imaging apparatus.

According to some embodiments, a solid-state imaging apparatus comprising: a substrate comprising a pixel region where a photoelectric conversion element is arranged; a first structure comprising: a first insulating film having a first opening portion which is over the photoelectric conversion element; and a wiring layer in the first insulating film; a first insulator comprising: a first portion arranged in the first opening portion; and a second portion covering an upper surface of the first portion and an upper surface of the first structure other than an inner surface of the first opening portion, the first portion and the second portion contacting each other and containing the same material; a second structure comprising: a second insulating film having a second opening portion which is over the first opening portion; and a wiring layer arranged in the second insulating film; and a second insulator comprising a third portion in the second opening portion, wherein a hydrogen concentration of the second portion of the first insulator is higher than a hydrogen concentration of a portion of the first insulating film, and an area of an upper surface of the first portion is larger than an area of a lower surface of the third portion which is over the first portion, is provided.

According to some other embodiments, a camera comprising: a solid-state imaging apparatus; and a signal processing unit configured to process a signal obtained in the solid-state imaging apparatus, wherein the solid-state imaging apparatus comprises: a substrate comprising a pixel region where a photoelectric conversion element is arranged, a first structure comprising: a first insulating film having a first opening portion which is over the photoelectric conversion element; and a wiring layer in the first insulating film; a first insulator comprising: a first portion in the first opening portion; and a second portion covering an upper surface of the first portion and an upper surface of the first structure other than an inner surface of the first opening portion, the first portion and the second portion contacting each other and containing the same material; a second structure comprising: a second insulating film having a second opening portion which is over the first opening portion; and a wiring layer in the second insulating film, and a second insulator comprising a third portion in the second opening portion, wherein a hydrogen concentration of the second portion of the first insulator is higher than a hydrogen concentration of a portion which forms the first insulating film, and wherein an area of an upper surface of the first portion is larger than an area of a lower surface of the third portion which is over the first portion, is provided.

According to some other embodiments, a method of manufacturing a solid-state imaging apparatus, the method comprising: forming a substrate comprising a pixel region where a photoelectric conversion element is arranged; forming a first structure comprising a first insulating film having a first opening portion which is over the photoelectric conversion element, and a wiring layer in the first insulating film; forming a first insulator comprising a first portion in the first opening portion, and a second portion covering an upper surface of the first portion and an upper surface of the first structure other than an inner surface of the first opening portion, the first portion and the second portion being formed continuously from the same material; forming a second structure comprising a second insulating film having a second opening portion which is over the first opening portion, and a wiring layer in the second insulating film; and forming a second insulator comprising a third portion in the second opening portion, wherein a hydrogen concentration of the second portion of the first insulator is higher than a hydrogen concentration of a portion of the first insulating film, and an area of the upper surface of the first portion is larger than an area of a lower surface of the third portion which is over the first portion, is provided.

Further features of the present invention will become apparent from the following description of exemplary embodiments (with reference to the attached drawings).

BRIEF DESCRIPTION OF THE DRAWINGS

FIGS. 1A and 1B are sectional views each showing the arrangement of a solid-state imaging apparatus according to the present invention;

FIGS. 3A to 3C are sectional views showing the manufacturing process of the solid-state imaging apparatus of FIG. 1A.

DESCRIPTION OF THE EMBODIMENTS

Figure 2A:
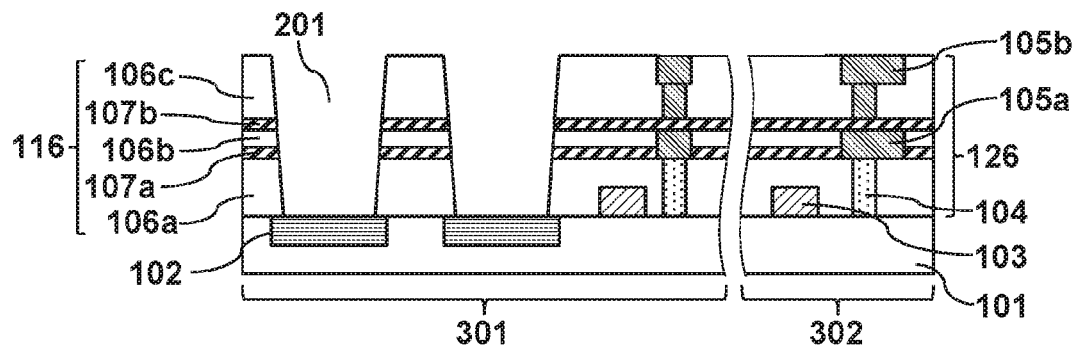
FIGS. 2A to 2C are sectional views showing a manufacturing process of the solid-state imaging apparatus of FIG. 1A.

A practical embodiment of a solid-state imaging apparatus of the present invention will be described below with reference to the accompanying drawings. Note that in a description and the drawings below, common reference numerals denote common arrangements throughout the plurality of drawings. Therefore, the common arrangements will be described by referring to the plurality of drawings mutually, and descriptions of the arrangements denoted by the common reference numerals will be omitted as needed.

FIG. 1A is a sectional view showing an example of the arrangement of a solid-state imaging apparatus 100 according to this embodiment. A substrate 101 using a semiconductor includes a pixel region 301 where a plurality of pixels, including photoelectric conversion portions 102 in which photoelectric conversion elements are arranged, are arranged and a peripheral circuit region 302 where a peripheral circuit which processes a signal output from each pixel is arranged. On the substrate 101, a first insulating film 116 having opening portions each arranged on the photoelectric conversion element of the photoelectric conversion portion 102, and a first structure 126 including wiring layers 105a and 105b arranged in the first insulating film are arranged. A suffix such as "a" or "b" is added to reference numeral of a constituent element when a particular wiring layer out of wiring layers 105 is denoted. This also applies to other constituent elements. Each wiring layer 105 may use an electrical conductor such as a metal. In this embodiment, each wiring layer 105 uses a metal mainly containing copper. The first insulating film 116 includes interlayer insulating films 106a, 106b, and 106c used as interlayer films among the substrate 101, and the wiring layers 105a and 105b, and anti-diffusion films 107a and 107b which prevent diffusion of the copper used for each wiring layer 105. For example, silicon oxide can be used for interlayer insulating films 106. For example, silicon carbide or silicon nitride can be used for anti-diffusion films 107. A gate electrode 103 using, for example, polysilicon of a transistor which forms a pixel, a circuit, or the like and a conductive plug 104 using an electrical conductor such as a metal which electrically connects the wiring layer 105a and the pixel or circuit can be arranged in the first insulating film 116.

A first portion 2111 of a first insulator 211 is arranged in each opening portion of the first insulating film 116. The upper surface of each first portion 2111 and the upper surface of the first structure 126 other than the opening portions of the first insulating film 116 are covered with a second portion 2112 of the first insulator 211. The first portions 2111 and the second portion 2112 contact each other, contain the same material, and are formed continuously from the same material as shown in a manufacturing method to be described later. The second portion 2112 connects the adjacent first portions 2111 with each other and covers the pixel region 301. Further, the second portion 2112 may extend not only to the pixel region 301 but also to the peripheral circuit region 302 to cover the peripheral circuit region 302. A material having a higher refractive index than the interlayer insulating films 106 is used for the first insulator 211, which is arranged on the photoelectric conversion portions 102. In this embodiment, silicon nitride having a higher refractive index than the interlayer insulating films 106 using silicon oxide is used for the first insulator 211.

A second structure 127 including a second insulating film 117 having opening portions each arranged on the opening portion of the first insulating film 116 and a wiring layer 105c arranged in the second insulating film 117 is arranged on the first insulator 211. In this embodiment, the wiring layer 105c uses a metal that has copper as a main component. The second insulating film 117 includes interlayer insulating films 106d and 106e using, for example, silicon oxide, and an anti-diffusion film 107c using, for example, silicon carbide or silicon nitride.

A third portion 2121 of a second insulator 212 is arranged in each opening portion of the second insulating film 117. The upper surface of each third portion 2121 and the upper surface of the second structure 127 other than the opening portions of the second insulating film 117 may be covered with a fourth portion 2122 of the second insulator 212. The fourth portion 2122 can connect the adjacent third portions 2121 with each other and cover the pixel region 301. Further, the fourth portion 2122 may extend not only to the pixel region 301 but also to the peripheral circuit region 302 to cover the peripheral circuit region 302. Like the first insulator 211, material having the higher refractive index than the interlayer insulating films 106 is used for the second insulator 212.

A passivation film 108 and a planarizing film 109 are arranged on the second insulator 212. Color filter layers 110a and 110b corresponding to a plurality of colors are arranged on the planarizing film 109. On-chip lenses 111 are arranged on color filter layers 110.

In this embodiment, the first insulator 211 and the second insulator 212 each having a higher refractive index than the interlayer insulating films 106 form the core portions of light waveguides which efficiently collect light that has entered the respective pixels of the solid-state imaging apparatus 100 to the photoelectric conversion elements arranged in the photoelectric conversion portions 102.

Note that the area of the upper surface of the first portion 2111 of the first insulator 211 embedded in the opening portion of the first insulating film 116 forming the core portion is larger than the area of the lower surface of the third portion 2121 of the second insulator 212 embedded in the opening portion of the second insulating film 117. When the area of the upper surface of each first portion 2111 is smaller than the area of the lower surface of each third portion 2121 arranged on it, there is the possibility that light passing from the third portion 2121 that is outside the first portion 2111 does not enter the first portion 2111. For example, light may diffuse from the third portions 2121 into the first structure 126, resulting in a decrease in light collection efficiency. To prevent this, a structure is made in which the area of the upper surface of each first portion 2111 is formed to be larger than the area of the lower surface of each third portion 2121, and light that has passed through the third portion 2121 enters the first portion 2111. A tapered shape may be adopted, whose area in a cross section parallel to the surface of the substrate 101 of each opening portion formed in the first insulating film 116 and the second insulating film 117 increases as a distance from the substrate 101 increases. It becomes possible to more efficiently collect light that has entered the pixels by causing each of the first insulator 211 and the second insulator 212 that form the core portions of the light waveguides formed in these opening portions to have a tapered shape.

A method of manufacturing the solid-state imaging apparatus 100 of this embodiment will now be described with reference to FIGS. 2A to 2C and FIGS. 3A to 3C. Each of FIGS. 2A to 2C and FIGS. 3A to 3C shows the outline of the sectional structure in each step of manufacturing the solid-state imaging apparatus 100.

First, the pixel region 301 and the peripheral circuit region 302 are formed in the substrate 101. In the pixel region 301, the plurality of pixels which include the photoelectric conversion portions 102 where the photoelectric conversion elements are arranged, transistors for outputting signals based on charges generated in the photoelectric conversion elements, and the like are formed. In the peripheral circuit region 302, the peripheral circuit is formed where a transistor or the like which processes the signal output from each pixel is arranged. The substrate 101 may be a semiconductor substrate of silicon or the like. Further, for example, a semiconductor layer may be formed on an insulating substrate, and then the pixel region 301 and the peripheral circuit region 302 may be formed there.

The interlayer insulating film 106a, which uses silicon oxide, is formed, by using a Chemical Vapor Deposition method (CVD method) for example, on the substrate 101 in which the pixel region 301 and the peripheral circuit region 302 are formed. Then, the conductive plug 104 is formed.

Next, the anti-diffusion film 107a, which uses silicon carbide, and the interlayer insulating film 106b, which uses silicon oxide, are formed, and the first wiring layer 105a mainly containing copper is formed by using a damascene method. Then, the anti-diffusion film 107b, which uses silicon carbide, and the interlayer insulating film 106c, which uses silicon oxide, are formed, and the second wiring layer 105b mainly containing copper is formed. Next, in a planar view with respect to the substrate of the solid-state imaging apparatus 100, a resist pattern having an opening portion on a position overlapping the photoelectric conversion portion 102 of each pixel is formed by using, for example, a photolithography method. Via the opening portion of this resist pattern, the first insulating film 116 including the interlayer insulating films 106a, 106b, and 106c and the anti-diffusion films 107a and 107b is etched to form openings by using, for example, a plasma etching method. Consequently, the first portions 2111 of the first insulator 211 are embedded and opening portions 201 as the first opening portions are formed. FIG. 2A shows a state when the opening portions 201 are formed.

Figure 2B:
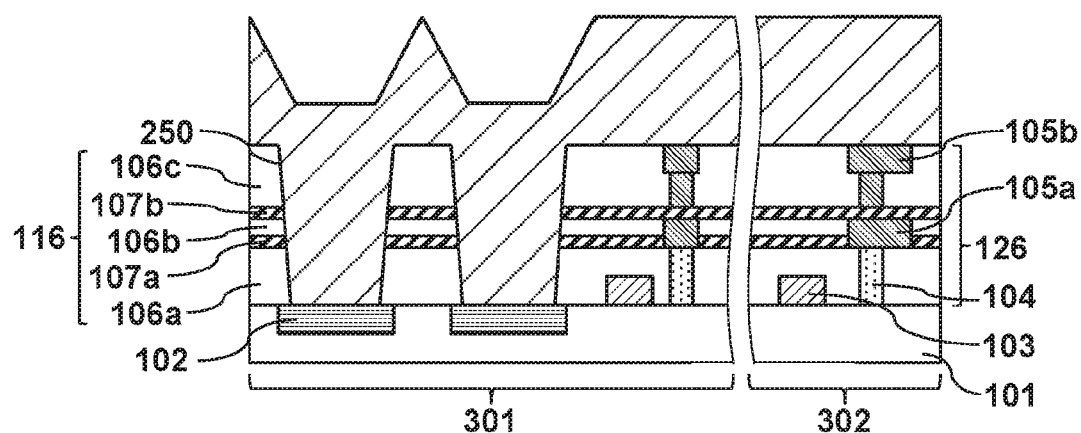

Next, as shown in FIG. 2B, a deposition apparatus using a plasma, for example by using a high-density plasma CVD method, deposits silicon nitride as the material of the first insulator 211, thereby forming a first material film 250. The first material film 250 is embedded in the opening portions 201, and is formed on the first structure 126 including the first insulating film 116 and the wiring layers 105a and 105b. The first material film 250 which uses silicon nitride formed by the high-density plasma CVD method or the like contains more hydrogen than the interlayer insulating films 106 using silicon oxide. Hence, the concentration of hydrogen contained in the first insulator 211 formed from the first material film 250 can be higher than that of a portion which forms the first insulating film 116. For example, the first insulator 211 has a hydrogen concentration of 15% or more. This can be measured by using, for example, Time of Flight Secondary Ion Mass Spectrometry (TOF-SIMS). The hydrogen concentration can also use a value of an average hydrogen concentration of one region. For example, the hydrogen concentration of the first insulator 211 may use a value of the hydrogen concentration of the second portion 2112. Furthermore, for example, the hydrogen concentration of the portion which forms the first insulating film 116 may use values of the hydrogen concentrations of the interlayer insulating films 106a, 106b, and 106c or may use a value of the average hydrogen concentration between the interlayer insulating films 106a, 106b, and 106c and the anti-diffusion films 107a and 107b.

Figure 2C:
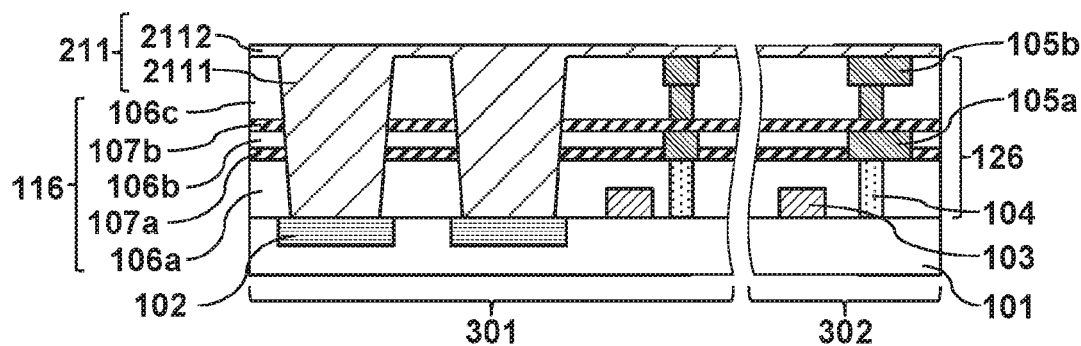

Next, a planarizing process of polishing the formed first material film 250 is performed by using, for example, a Chemical Mechanical Polishing method (CMP method). As shown in FIG. 2C, the first insulator 211 including the first portions 2111 and the second portion 2112 is formed by performing the planarizing process. In the planarizing process, planarization is performed such that silicon nitride having a film thickness of about 20 nm to 100 nm remains on the interlayer insulating film 106c of the first structure 126 and extends on the first structure 126 on the periphery of the opening portions 201. When planarization is performed by the CMP method, there is a difference in polishing rate between the silicon nitride used for the first insulator 211 and the silicon oxide or the metal present on the upper surface of the first structure 126. Therefore, erosion may occur when the silicon nitride on the first structure 126 is polished to the surface of the first structure 126. Consequently, thickness unevenness may occur in the first insulator 211. When the thickness unevenness occurs in the first insulator 211 which forms the core portions of the light waveguides, color unevenness or the like may occur by a difference in an optical path length in a completed radiation imaging apparatus. In this embodiment, it becomes possible, by leaving the silicon nitride on the first structure 126 as the second portion 2112, to suppress occurrence of the color unevenness caused by the thickness unevenness. The second portion 2112 of the first insulator 211 may function as an anti-diffusion film by contact with the upper surface of the wiring layer 105b.

Then, the interlayer insulating film 106d, which uses silicon oxide, is formed so as to cover the first insulator 211. After that, the wiring layer 105c is formed by using the damascene method, as shown in FIG. 3A. When the wiring layer 105c is formed, the second portion 2112 of the first insulator 211 may function as an etching stop layer which forms a trench structure.

Then, the anti-diffusion film 107c and the interlayer insulating film 106e are formed. After that, in the planar view with respect to the substrate 101, a resist pattern having opening portions in positions overlapping the opening portions 201 (first insulator 211) formed in the first insulating film 116 is formed on the interlayer insulating film 106e by using, for example, the photolithography method. Via the opening portions of this resist pattern, the second insulating film 117 including the interlayer insulating films 106d and 106e and the anti-diffusion film 107c is etched by using, for example, the plasma etching method, thereby forming opening portions 202 as the second opening portions, as shown in FIG. 3B. When the opening portions 202 are formed, the second portion 2112 out of the first insulator 211 may function as the etching stop layer. These opening portions 202 are embedded by using, for example, the same step as the step of forming the first insulator 211 described above. Silicon nitride as the material of the second insulator 212 is deposited by using, for example, the high-density plasma CVD method and the planarizing process is performed by the CMP method. As shown in FIG. 3C, the second insulator 212 including the third portions 2121 and the fourth portion 2122 is formed by these steps. If the same step as the step of forming the first insulator 211 is used for a step of forming the second insulator, the concentration of hydrogen contained in the second insulator 212 can be higher than that of a portion which forms the second insulating film 117.

Then, the passivation film 108 and the planarizing film 109, which uses a resin for example, are formed on the second insulator 212. The color filter layers 110a and 110b corresponding to the plurality of colors are formed on the planarizing film 109. The on-chip lenses 111 are formed on the color filter layers 110. The solid-state imaging apparatus 100 shown in FIG. 1A is formed by these steps.

The second insulator 212 is not limited to formation using the same step as the step of forming the first insulator 211. The second insulator 212 may be formed by, for example, embedding an organic material. In this case, the second insulator 212 may be formed by using, for example, coating. Further, the second insulator 212 may have a stacked layer structure of the passivation film 108 and the color filter layers 110 like a solid-state imaging apparatus 100' shown in FIG. 1B. In this case, after the opening portions 202 are formed, the passivation film 108, which uses silicon nitride for example, is formed on the second structure 127. Then, color filter materials corresponding to the plurality of colors are embedded in the opening portions 202, thereby forming the color filter layers 110a and 110b. In this case, the passivation film 108 having a higher refractive index than the interlayer insulating films 106d and 106e covers the surfaces of the opening portions 202 of the second insulating film 117, and the color filter layers 110a and 110b are arranged in a region not contacting the second insulating film 117. After the second insulator 212 is formed, the on-chip lenses 111 are formed on the second insulator 212, thereby forming the solid-state imaging apparatus 100' shown in FIG. 1B.

The effect of this embodiment will now be described. Along with the advance of miniaturization of the pixels in the solid-state imaging apparatus, the level of an output signal tends to be low. Thus, a reduction in noise is desired. Silicon nitride formed by using the high-density plasma CVD method or the like contains more hydrogen than silicon oxide. A structure of Japanese Patent Laid-Open No. 2004-193500 describes a reduction in noise by performing hydrogen sintering by using silicon nitride which forms the core portion of a light waveguide as a hydrogen supply source and supplying hydrogen to a photoelectric conversion portion. In the structure of Japanese Patent Laid-Open No. 2004-193500, however, the silicon nitride is formed only on the photoelectric conversion portion, resulting in a smaller supply amount of hydrogen and an inability to supply sufficient hydrogen. Hydrogen cannot be supplied sufficiently to, for example, a transistor arranged on the periphery of the photoelectric conversion portion.

Figure 4:
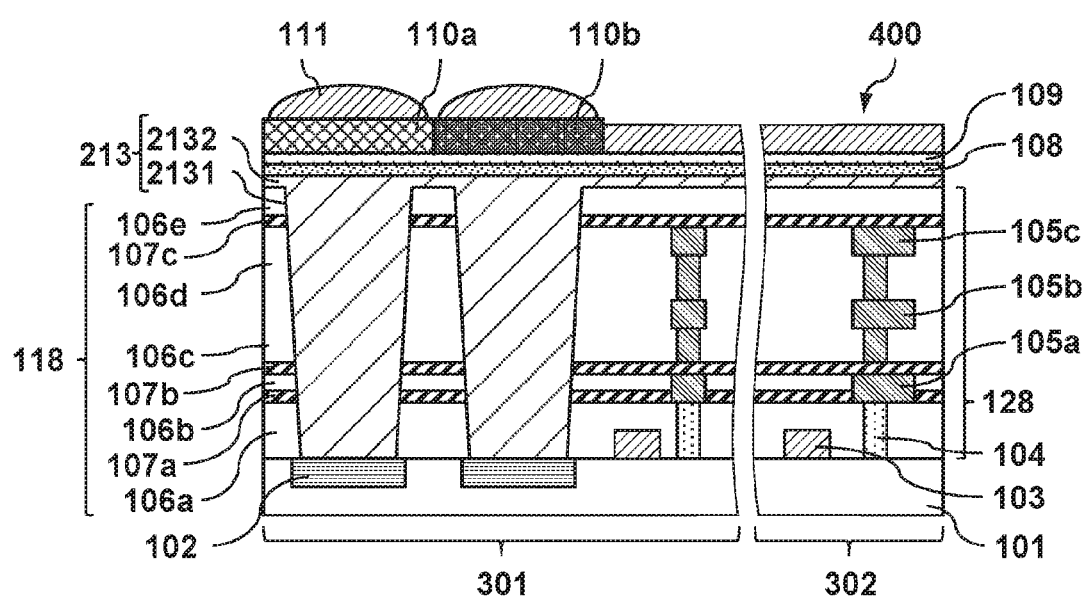
FIG. 4 is a sectional view showing the arrangement of a solid-state imaging apparatus in a comparative example.

The arrangement of a solid-state imaging apparatus 400 shown in FIG. 4 is considered as a comparative structure in order to increase the volume of silicon nitride containing much hydrogen and increase a hydrogen supply amount. In the solid-state imaging apparatus 400, an insulator 213, which uses silicon nitride, that forms the core portions of the light waveguides includes not only fifth portions 2131 embedded in an insulating film 118 but also a sixth portion 2132 which extends on a structure 128 including the insulating film 118 and the wiring layers 105. This makes it possible to increase the volume of silicon nitride serving as a hydrogen supply source. In the case of the solid-state imaging apparatus 400 having a multilayer wiring structure shown in FIG. 4, however, the substrate 101 and the sixth portion 2132 are spaced apart, and thus the effect of hydrogen sintering may not be sufficient. A number of wiring layers 105 exist between the substrate 101 and the sixth portion 2132. As a consequence, these wiring layers 105 may avoid the supply of hydrogen and reduce the effect of the hydrogen sintering.

To prevent this, in the solid-state imaging apparatus 100 of this embodiment, the core portion of each light waveguide has a two-layer structure of the first insulator 211 and the second insulator 212. The first insulator 211 includes the first portions 2111 arranged in the opening portions of the first insulating film 116 and the second portion 2112 which covers the first structure 126 including the first insulating film 116. As described above, the first insulator 211 using silicon nitride formed by the high-density plasma CVD method or the like contains much hydrogen, and the second portion 2112 of the first insulator 211 can have a higher hydrogen concentration than that of the portion which forms the first insulating film 116. The first insulator 211 has a hydrogen concentration of, for example, 15% or more. The volume of silicon nitride serving as the hydrogen supply source increases, enhancing a possibility of supplying sufficient hydrogen. The distance between the substrate 101 and the second portion 2112 of the first insulator 211, which is to be the hydrogen supply source, becomes shorter by adopting the two-layer structure for the core portion of each light waveguide. Some of the plurality of wiring layers 105 are arranged above the second portion 2112 by bringing the second portion 2112 closer to the substrate 101. The number of wiring layers 105 present between the substrate 101 and the second portion 2112 decreases, making it difficult for the wiring layers 105 to avoid the supply of hydrogen. With these arrangements, it becomes possible to efficiently supply hydrogen not only to the photoelectric conversion portions 102 but also to, for example, a transfer transistor or an amplification transistor arranged in the pixel region 301, and to reduce noise by increasing the effect of the hydrogen sintering. The second portion 2112 may extend not only to the pixel region but also to the peripheral circuit region 302. It becomes possible, by extending the second portion 2112 to the peripheral circuit region 302, to increase the effect of the hydrogen sintering also on a transistor or the like formed in the peripheral circuit region 302.

As described above, the area of the upper surface of each first portion 2111 is formed to be larger than the area of the lower surface of each third portion 2121 so as not to avoid light from entering from the second insulator 212 to the first insulator 211. It is therefore possible to more efficiently collect light that has entered the pixels even if the core portion of each light waveguide has the two-layer structure.

The first insulator 211 and the second insulator 212, which uses silicon nitride, may function as anti-diffusion films of the wiring layers. As shown in FIG. 1A, the second portion 2112 of the first insulator 211 contacts the upper surface of the wiring layer 105b and functions as the anti-diffusion film. The first insulator 211 and the second insulator 212 may also function as etching stop layers. When the wiring layer 105c is formed, the second portion 2112 of the first insulator 211 functions as the etching stop layer which forms the trench structure. It becomes possible, by causing the first insulator 211 and the second insulator 212 to function as the anti-diffusion films and the etching stop layers, to suppress an increase in the number of steps caused by forming the core portions of the light waveguides by dividing them into a plurality of layers.

In this embodiment, the solid-state imaging apparatus 100 has a multilayer structure of three wiring layers 105, five interlayer insulating films 106, and three anti-diffusion films 107. However, the present invention is not limited to this. For example, there may be only one wiring layer 105. In this case, the wiring layer 105 may be arranged above the second portion 2112. For example, there may also be two, or four or more wiring layers 105. The range of the film thickness of the second portion 2112 described above does not limit the present invention.

As an application of the solid-state imaging apparatus 100 according to the above-described embodiment, a camera in which this solid-state imaging apparatus 100 is assembled will exemplarily be described below. The concept of the camera includes not only an apparatus mainly aiming at shooting but also an apparatus (for example, a personal computer or a portable terminal) accessorily having a shooting function. The camera may be a module part such as a camera head. The camera includes the solid-state imaging apparatus 100 according to the present invention exemplified as the above-described embodiment, and a signal processing unit which processes a signal output from this solid-state imaging apparatus 100. The signal processing unit can include, for example, a processor which processes digital data based on the signal obtained from the solid-state imaging apparatus 100. An A/D converter configured to generate this digital data may be provided on a semiconductor substrate of the solid-state imaging apparatus 100 or on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-123107, filed Jun. 18, 2015, which is hereby incorporated by reference wherein in its entirety.

What is claimed is:

1. A solid-state imaging apparatus comprising:
   a substrate comprising a pixel region where a photoelectric conversion element is arranged;
   a first structure comprising:
      a first insulating film having a first opening portion which is over the photoelectric conversion element; and
      a wiring layer in the first insulating film;
   a first insulator comprising:
      a first portion arranged in the first opening portion; and
      a second portion covering an upper surface of the first portion and an upper surface of the first structure other than an inner surface of the first opening portion, the first portion and the second portion contacting each other and containing the same material;
   a second structure comprising:
      a second insulating film having a second opening portion which is over the first opening portion; and
      a wiring layer arranged in the second insulating film; and
   a second insulator comprising a third portion in the second opening portion,
   wherein a hydrogen concentration of the second portion of the first insulator is higher than a hydrogen concentration of a portion of the first insulating film, and
   an area of an upper surface of the first portion is larger than an area of a lower surface of the third portion which is over the first portion.

2. The apparatus according to claim 1, wherein the first insulator contains silicon nitride.

3. The apparatus according to claim 1, wherein a hydrogen concentration of the first insulator is not less than 15%.

4. The apparatus according to claim 1, wherein the first opening portion has a tapered shape such that, in a cross section parallel to a surface of the substrate, an area of the first opening portion increases as a distance from the substrate increases.

5. The apparatus according to claim 1, wherein the substrate further includes a peripheral circuit region where a peripheral circuit is arranged, and
   the second portion extends to a region over the peripheral circuit region.

6. The apparatus according to claim 1,
   wherein the second insulator further includes a fourth portion which covers an upper surface of the third portion and an upper surface of the second structure other than an inner surface of the second opening portion, and
   wherein the third portion and the fourth portion contact each other and contain the same material.

7. The apparatus according to claim 5,
   wherein the second insulator further includes a fourth portion which covers an upper surface of the third portion and an upper surface of the second structure other than an inner surface of the second opening portion,
   wherein the third portion and the fourth portion contact each other and contain the same material, and
   wherein the fourth portion extends to a region over the peripheral circuit region.

8. The apparatus according to claim 1, wherein a hydrogen concentration of the second insulator is higher than a hydrogen concentration of a portion of the second insulating film.

9. The apparatus according to claim 1, wherein the second insulator contains silicon nitride.

10. The apparatus according to claim 1, wherein the second insulator contains an organic material.

11. The apparatus according to claim 1, wherein the second opening portion has a tapered shape such that, in a cross section parallel to a surface of the substrate, an area of the second opening portion increases as a distance from the substrate increases.

12. The apparatus according to claim 1,
    wherein the second insulator includes a color filter, and
    wherein the color filter is arranged in the second opening portion of the second insulator and does not contact with the second insulating film.

13. The apparatus according to claim 1, wherein the wiring layer contains copper.

14. A camera comprising:
    a solid-state imaging apparatus; and
    a signal processing unit configured to process a signal obtained in the solid-state imaging apparatus,
    wherein the solid-state imaging apparatus comprises:
    a substrate comprising a pixel region where a photoelectric conversion element is arranged,
    a first structure comprising:
       a first insulating film having a first opening portion which is over the photoelectric conversion element; and
       a wiring layer in the first insulating film;
    a first insulator comprising:
       a first portion in the first opening portion; and
       a second portion covering an upper surface of the first portion and an upper surface of the first structure other than an inner surface of the first opening portion, the first portion and the second portion contacting each other and containing the same material,
    a second structure comprising:
       a second insulating film having a second opening portion which is over the first opening portion; and
       a wiring layer in the second insulating film, and
    a second insulator comprising a third portion in the second opening portion,
    wherein a hydrogen concentration of the second portion of the first insulator is higher than a hydrogen concentration of a portion which forms the first insulating film, and
    wherein an area of an upper surface of the first portion is larger than an area of a lower surface of the third portion which is over the first portion.

15. A method of manufacturing a solid-state imaging apparatus, the method comprising:
    forming a substrate comprising a pixel region where a photoelectric conversion element is arranged;
    forming a first structure comprising a first insulating film having a first opening portion which is over the photoelectric conversion element, and a wiring layer in the first insulating film;
    forming a first insulator comprising a first portion in the first opening portion, and a second portion covering an upper surface of the first portion and an upper surface of the first structure other than an inner surface of the first opening portion, the first portion and the second portion being formed continuously from the same material;
forming a second structure comprising a second insulating film having a second opening portion which is over the first opening portion, and a wiring layer in the second insulating film; and
forming a second insulator comprising a third portion in the second opening portion,
wherein a hydrogen concentration of the second portion of the first insulator is higher than a hydrogen concentration of a portion of the first insulating film, and
an area of the upper surface of the first portion is larger than an area of a lower surface of the third portion which is over the first portion.

* * * * *